United States Patent
Pavlovic et al.

(10) Patent No.: US 9,584,177 B2
(45) Date of Patent: Feb. 28, 2017

(54) TIME TO DIGITAL CONVERTER AND PHASE LOCKED LOOP

(71) Applicant: NXP B.V., Eindhoven (NE)

(72) Inventors: Nenad Pavlovic, Eindhoven (NE); Vladislav Dyachenko, Eindhoven (NE); Tarik Saric, Eindhoven (NE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/041,217

(22) Filed: Feb. 11, 2016

(65) Prior Publication Data
US 2016/0241301 A1    Aug. 18, 2016

(30) Foreign Application Priority Data

Feb. 17, 2015    (EP) ..................................... 15155328

(51) Int. Cl.
*H04L 1/00*    (2006.01)
*H04B 1/7073*    (2011.01)
(Continued)

(52) U.S. Cl.
CPC .......... *H04B 1/7073* (2013.01); *H03C 3/0941* (2013.01); *H03C 3/0958* (2013.01);
(Continued)

(58) Field of Classification Search
CPC ........... H04B 1/706; H04B 1/69; H04L 7/033; H03L 7/0891
(Continued)

(56) References Cited

U.S. PATENT DOCUMENTS 7,535,311 B2    5/2009  Nergis
2007/0036238 A1    2/2007  Matero et al.
(Continued)

OTHER PUBLICATIONS

C.-M. Hsu, M. Z. Straayer, and M. H. Perrott, "A Low-Noise Wide-BW 3.6-GHz Digital SD Fractional-N Frequency Synthesizer With a Noise-Shaping Time-to-Digital Converter and Quantization Noise Cancellation," IEEE Journal of Solid-State Circuits, vol. 43, No. 12, pp. 2776-2786, Dec. 2008.
(Continued)

*Primary Examiner* — Khai Tran

(57) ABSTRACT

A phase locked loop is disclosed having a frequency controlled oscillator, a feedback path, a time to digital converter and a memory. The frequency controlled oscillator comprises a first control input for varying the frequency of the output of the frequency controlled oscillator so as to track a reference frequency and a second control input for modulating the frequency of the output signal so as to produce a chirp. The feedback path is configured to provide an input signal to the time to digital converter, and comprises modulation cancelling module operable to remove the frequency modulation resulting from the second control input from the output signal. The memory stores second control input values that each correspond with a desired chirp frequency and which compensate for non-linearity in the response of the frequency controlled oscillator to the second control input. The phase locked loop is operable in a chirp mode, in which the second control input is produced by determining a value for the second control input corresponding with a desired chirp frequency based on the stored second control input values in the memory, and in which the phase locked loop is configured to determine the first control input based on the feedback path from which the modulation cancelling module has removed the frequency modulation resulting from the second control input.

15 Claims, 13 Drawing Sheets

(51) Int. Cl.
H03L 7/197 (2006.01)
H04B 1/69 (2011.01)
H03C 3/09 (2006.01)

(52) U.S. Cl.
CPC ......... H03C 3/0991 (2013.01); H03L 7/1976 (2013.01); *H03C 3/0933* (2013.01); *H04B 2001/6912* (2013.01); *H04B 2201/7073* (2013.01)

(58) Field of Classification Search
USPC ...... 375/139, 375, 376; 327/156; 331/177 R; 455/103, 127, 307
See application file for complete search history.

(56) References Cited

U.S. PATENT DOCUMENTS

2010/0277245 A1* 11/2010 Liu .................. H03L 7/0893 331/34
2011/0267150 A1* 11/2011 Fan ..................... H03L 1/02 331/36 R

OTHER PUBLICATIONS

H. Sakurai, Y. Kobayashi, T. Mitomo, O. Watanabe, and S. Otaka, "A 1.5GHz-modulation-range 10ms-modulation-period 180kHzrms-frequency-error 26MHz-reference mixed-mode FMCW synthesizer for mm-wave radar application," in Solid-State Circuits Conference Digest of Technical Papers (ISSCC), 2011 IEEE International, 2011, pp. 292-294.

J. Lee, Y.-A. Li, M.-H. Hung, and S.-J. Huang, "A Fully-Integrated 77-GHz FMCW Radar Transceiver in 65-nm CMOS Technology," IEEE Journal of Solid-State Circuits, vol. 45, No. 12, pp. 2746-2756, 2010.

C. S. Vaucher, I. Ferencic, M. Locher, S. Sedvallson, U. Voegeli, and Z. Wang, "A family of low-power truly modular programmable dividers in standard 0.35- mu;m CMOS technology," Solid-State Circuits, IEEE Journal of, vol. 35, No. 7, pp. 1039-1045, Jul. 2000.

P. J. A. Harpe, C. Zhou, Y. Bi, N. P. ver der Meijs, X. Wang, K. Philips, G. Dolmans, and H. de Groot, "A 26 uW 8 bit 10 MS/s Asynchronous SAR ADC for Low Energy Radios," Solid-State Circuits, IEEE Journal of, vol. 46, No. 7, pp. 1585-1595, Jul. 2011.

A. Swaminathan, K. J. Wang, and I. Galton, "A Wide-Bandwidth 2.4 GHz ISM Band Fractional-N PLL With Adaptive Phase Noise Cancellation," Solid-State Circuits, IEEE Journal of, vol. 42, No. 12, pp. 2639-2650, Dec. 2007.

K. Muhammad, Y.-C. Ho, T. L. Mayhugh, C.-M. Hung, T. Jung, I. Elahi, C. Lin, I. Deng, C. Fernando, J. L. Wallberg, S. K. Vemulapalli, S. Larson, T. Murphy, D. Leipold, P. Cruise, J. Jaehnig, M.-C. Lee, R. B. Staszewski, R. Staszewski, and K. Maggio, "The First Fully Integrated Quad-Band GSM/GPRS Receiver in a 90-nm Digital CMOS Process," IEEE Journal of Solid-State Circuits, vol. 41, No. 8, pp. 1772-1783, 2006.

H.-H. Chang, P.-Y. Wang, J.-H. C. Zhan, and B.-Y. Hsieh, "A Fractional Spur-Free ADPLL with Loop-Gain Calibration and Phase-Noise Cancellation for GSM/GPRS/EDGE," in Solid-State Circuits Conference, 2008. ISSCC 2008. Digest of Techincal Papers. IEEE International, 2008, pp. 200-606.

W. Wu, R. Staszewski, J. Long, "A 56.4-to-63.4 GHz Multi-Rate All-Digital Fractional-N PLL for FMCW Radar Applications in 65 nm CMOS," IEEE Journal of Solid-State Circuits, vol. 49, No. 5, May 2014.

Z. Xu, S. Lee, M. Miyahara, A. Matsuzawa, "A 0.84ps-LSB 2.47mW Time-to-Digital Converter Using Charge Pump and SAR-ADC," Custom Integrated Circuits Conference (CICC) 2013 IEEE, Sep. 22-25, 2013, pp. 1-4.

* cited by examiner

TIME TO DIGITAL CONVERTER AND PHASE LOCKED LOOP

This application claims the benefit of European Patent Application No. 15155328.6 entitled "Time to Digital Converter and Phase Locked Loop", having a filing date of Feb. 17, 2015, having common inventors, and having a common assignee, all of which is incorporated by reference in its entirety.

FIELD

The disclosure relates to a time to digital converter and a phase locked loop. More particularly, the disclosure relates to a time to digital converter for use in a digital phase locked loop, and to a phase locked loop that is suitable for producing a chirp signal.

BACKGROUND

Phase locked loops are used to generate an output signal with a defined phase relationship with an input reference signal. The output signal is matched to the phase of the input reference signal by a feedback loop in which the phase difference between the input reference signal and the output signal is determined by a phase detector. In an analog phase locked loop, the phase detector provides an analog output to an analog loop filter, which in turn provides an input to a voltage controlled oscillator, which causes the frequency of the oscillator to track the reference signal by maintaining a fixed phase relationship therewith. In a digital phase locked loop, a time to digital converter (TDC) may be used to determine a timing difference between the output from a frequency controlled oscillator and the reference signal. The loop filter in a digital phase locked loop may be a digital loop filter. In some digital phase locked loops, a numerically controlled oscillator may be used. An all-digital phase locked loop comprises a digital detector for determining the phase difference, a digital loop filter and a numerically controlled oscillator.

The resolution and noise characteristics of a TDC for use in a phase locked loop is important in determining the performance characteristics of the phase locked loop.

Time to digital converters used in prior art high performance phase locked loops typically comprise a cascade of delay elements (e.g. a gated ring oscillator, as described in C.-M. Hsu, M. Z. Straayer, and M. H. Perrott, "*A Low-Noise Wide-BW 3.6-GHz Digital SD Fractional-N Frequency Synthesizer With a Noise-Shaping Time-to-Digital Converter and Quantization Noise Cancellation,*" IEEE Journal of Solid-State Circuits, vol. 43, no. 12, pp. 2776-2786, December 2008.) In such an architecture a problematic ground bounce is typically generated by sampling flip-flops of the TDC due to the unary coded (thermometer coded) nature of the delay line. In order to provide sufficient dynamic range, the TDC dynamic range is extended by using a counter to count a phase wrapping of the TDC. If the stop signal coincides with the counter clock, the phase information may be corrupted. Furthermore, good matching of the characteristics of each delay element is necessary to avoid errors in delay matching. Both the load capacitance and active part of each delay element are important for delay matching. It is challenging to obtain sufficiently good matching to obtain low noise characteristics from the TDC.

A prior art time to digital converter comprising a successive approximation register analog to digital converter is disclosed in Zule Xu et al., *Picosecond Resolution Time-to-Digital Converter Using Gm-C Integrator and SAR-ADC*, IEEE Transactions on Nuclear Science, vol. 61, No. 2, April 2014, but this implementation is not promising because it consumes too much power and has a limited dynamic range (consuming 20 mW for conversion rate of 10 MHz and having a limited dynamic range).

A time to digital converter that addresses at least some of the above mentioned problems is desired.

An important application for high performance phase locked loops is in frequency modulated continuous wave (FMCW) radar. One application for such radar devices is as proximity detectors in vehicles, for example for maintaining a safe distance from obstacles. In such applications it is necessary to produce a chirp signal with a highly linear variation in frequency with respect to time (because the frequency of the detected return signal is used to infer distance). For good distance resolution, a high degree of accuracy in the frequency output from the chirp generator is required. Furthermore, this application is challenging because of the high frequency tuning range and the required rate of change of the frequency. Typically there is a compromise between accuracy and rate of change and/or dynamic range in a phase locked loop. Known strategies for limiting the output noise of a phase locked loop, such as limiting the bandwidth of the phase locked loop are in conflict with the requirement for a large tuning range and high chirp speed.

A phase locked loop capable of overcoming at least some of the above mentioned problems is desired.

SUMMARY

According to a first aspect, there is provided a time to digital converter comprising:

a synchronisation block configured to output a voltage pulse with duration based on a time difference between a reference oscillating signal and an input oscillating signal;

a charge pump arranged to receive the voltage pulse and to convert the voltage pulse into a current pulse;

an integrator comprising an integrator capacitor, the integrator being configured to receive the current pulse and integrate the current pulse as a charge on the integrator capacitor, resulting in an integrator output voltage; and a successive approximation register configured to determine the integrator output voltage with respect to a reference voltage by adjusting the charge on the integrator capacitor so as to reduce the integrator output voltage to within a least significant bit of a reference voltage by successive approximation, and configured to output the determined integrator output voltage as a digital signal.

The use of a successive approximation register analog to digital converter (SAR ADC) operating on a synchronisation signal that is integrated in the current/charge domain provides a time to digital converter that requires low power and which has low noise, high resolution and high bandwidth. This contrasts with prior art implantations of time to digital converters comprising a SAR ADC, which teach operating in the voltage domain using a Gm-C converter.

The charge pump may be configured to vary the amplitude of the current pulse in response to a charge pump control input. This allows a broader dynamic range by allowing the resolution of the SAR ADC to be varied.

The time to digital convertor may be configured to retain a residual remaining charge on the integrator capacitor after the integrator output voltage has been reduced to within a least significant bit of the reference voltage and the successive approximation register has been reset. Retaining this residual charge (corresponding with a residual voltage) results in dithering of the quantisation levels of the SAR ADC, which advantageously provides quantisation noise shaping.

The integrator may comprise a transconductance amplifier.

The integrator capacitor may be a first integrator capacitor and the integrator may further comprise a second integrator capacitor. The first integrator capacitor may be connected to a non-inverting input of the transconductance amplifier and the second integrator capacitor is connected to an inverting input of the transconductance amplifier.

The charge pump may comprise a first and second current source, the integrator being configured to integrate the output of the first current source on the first integrator capacitor and the output of the second current source on the second integrator capacitor.

This differential arrangement for the integrator may reduce noise, by providing common mode rejection of various noise sources.

The successive approximation register analog to digital converter may comprise a digital to analog converter operable to adjust the charge on the integrator capacitor when connected to an input of the integrator.

The time to digital converter may comprise a first switch that is operable to connect a common mode voltage to the digital to analog converter and a second switch that is operable to connect the digital to analog converter to an input of the integrator.

The time to digital converter may be operable, at the end of a conversion cycle to switch the first switch, then switch the second switch, then to reset the digital to analog converter. This sequence of switching may avoid sharing of charge between the SAR ADC and the integrator capacitor (or first and second integrator capacitors). The switching of the first switch provides a low impedance path for the first switch channel charge when the second switch turns off.

A common mode feedback block may be provided to sample a common mode voltage of a differential output of the integrator. The common mode feedback block may adjust a current amplitude of one of the first and/or second current sources, to cancel the common mode voltage at the output of the integrator. This improves matching between the current sources of the charge pump.

The time to digital converter may further comprise a comparator configured to test the output of the integrator and provide a comparator output signal based on the output of the integrator, the control logic being configured to receive the comparator output signal and to switch bits of the digital to analog converter based on the comparator output.

The control logic may be configured to implement a switching sequence for the LSB (least significant bit) to MSB-1 (most significant bit-1) of the digital to analog converter comprising: switch the state of the present bit, check the comparator output signal, and if the comparator output is in at first state, switch the present bit and the next bit, or if the comparator output is in a second state, retain the value of the present bit and to switch the next bit; the next bit being the next bit in order of decreasing significance from the present bit. The first state may be a high comparator output (e.g. corresponding with a positive integrator voltage output), and the second state may be a low comparator output (e.g. corresponding with a negative integrator voltage output). Alternatively, a low output could be the first state and a high output could be the second state. In further alternatives, a high comparator output may correspond with a first side of a predefined threshold integrator output voltage, and a low comparator output may correspond with a second (opposite) side of the threshold voltage.

For example, where there are 8 bits D7 (MSB) to D0 (LSB), the switching sequence for bits D6 to D0 may be as outlined above. For the MSB, the switching sequence may be different. The control logic may be configured to check the output of the comparator, and to switch the output of the MSB if the comparator output is negative.

This switching of two bits in a single step of the successive approximation cycle improves the speed of the SAR TDC, and reduces power consumption per conversion.

The control logic may be configured to, at the end of a successive approximation cycle: disconnect the integrator from the digital to analog converter and set the MSB to 0, reconnect the integrator to the digital to analog converter and switch the MSB, disconnect the integrator from the digital to analog converter and reset the digital to analog converter ready for the next successive approximation cycle. This may increase the dynamic range of the time to digital converter.

According to a second aspect, there is provided a phase-locked loop comprising a digital loop filter, a digitally controlled oscillator, and a time to digital converter according to the first aspect, wherein the time to digital converter determines a timing difference between a reference clock and an input signal based on the phase locked loop output, and the digital loop filter provides a control input to the digitally controlled oscillator based on the output of the time to digital converter.

A phase locked loop having this architecture addresses a number of problems with the prior art phase locked loops, enabling low power, high resolution, low noise and large bandwidth.

The phase locked loop may further comprise a frequency divider that receives the output of the phase locked loop and outputs the input signal to the time to digital converter.

The phase locked loop may further comprise a frequency control block that controls the operation of the frequency divider, wherein the frequency control block comprises a sigma-delta modulator for fractional-n frequency control.

The phase locked loop may further comprise a quantisation noise cancelling module, configured to receive a signal based on the output of the time to digital converter and to reduce quantisation noise arising from quantisation in the frequency control block and/or the time to digital converter.

According to a third aspect, there is provided a phase locked loop having a frequency controlled oscillator, a feedback path, a time to digital converter and a memory. The frequency controlled oscillator comprises a first control input for varying the frequency of the output of the frequency controlled oscillator so as to track a reference frequency and a second control input for modulating the frequency of the output signal so as to produce a chirp. The feedback path is configured to provide an input signal to the time to digital converter, and comprises a modulation cancelling module operable to remove the frequency modulation resulting from the second control input from the output signal. The memory stores second control input values that each correspond with a desired chirp frequency and which compensate for non-linearity in the response of the frequency controlled oscillator to the second control input. The phase locked loop is operable in a chirp mode, in which the second control input is produced by determining a value for the second control input corresponding with a desired chirp frequency based on the stored second control input values in the memory, and in which the phase locked loop is configured to determine the first control input based on the feedback path from which the modulation cancelling module has removed the frequency modulation resulting from the second control input.

The memory may be comprised as part of a look up table module, that determines the values of the second control input by at least one of:

finding a value for the second control input in the memory that most closely corresponds with the desired chirp frequency; and interpolating a value for the second control input with reference to at least one stored value.

The interpolation may be based on any suitable methodology, for example: linear interpolation, cubic interpolation, spline based interpolation, moving average interpolation etc.

The first control input provides a phase locked loop that compensates for temperature variations, and the second control input provides distortion corrected open loop control of the chirp frequency. The combination of open loop frequency modulation with a feedback loop from which the open loop frequency modulation has been removed allows the phase locked loop to maintain a very low phase error during rapid changes in frequency, without compromising the linearity of the chirp signal.

The phase locked loop may comprise a frequency divider that receives the output signal and outputs the input signal to the time to digital converter; and a control block that controls the operation of the frequency divider. The control block may comprise a sigma-delta modulator for fractional-n frequency control. This enables the use of a relatively low reference frequency clock, and provides a high degree of control over the output frequency of the phase locked loop.

The phase locked loop may further comprise a quantisation noise cancelling module, configured to receive a signal based on the output of the time to digital converter and to reduce quantisation noise arising from quantisation in the control block. Reducing quantisation noise in this way substantially improves the noise performance of the phase locked loop.

The modulation cancelling module may comprise the frequency divider. The frequency divider is a convenient way to remove the effect of the second control signal. The effect of the second control signal on the frequency of the output signal is known (from the relationship stored in the memory), so the frequency change resulting from the second control signal can be digitally removed by appropriately modifying the divider value provided to the frequency divider.

The second control input may comprise an analog input. The use of an analog input allows a smooth variation of frequency during a chirp, without the quantisation noise that may arise if the second control input were digital.

The first control input may comprise a digital control input. The feedback loop and tracking control path of the phase locked loop may therefore be effectively all-digital.

The frequency controlled oscillator may comprise a switched capacitor varactor responsive to the first control input, and an analog varactor responsive to the second control input.

The first control input may comprise a tracking input and an acquisition input, corresponding with a tracking switched capacitor bank and an acquisition switched capacitor bank, wherein the acquisition bank is operable to produce a larger tuning range of the frequency controlled oscillator than the tracking bank. The dual ranges may provide for faster acquisition, and reduced phase error once locked. During chirp mode, the acquisition tuning bank may be operable to maintain lock when the range of the tuning bank has been exceeded.

The phase locked loop may comprise a digital to analog converter (DAC), configured to convert the stored second control input values from the memory to an analog signal. The DAC thereby allows digital values stored in the memory to be converted to an analog signal for use as the second control input of the frequency controlled oscillator.

The phase locked loop may comprise a low pass filter between the output of the DAC and the second control input. The low pass filter may reduce quantisation noise arising from the DAC.

The phase locked loop may comprise a loop filter that receives a phase error signal based on the output of the time to digital converter. The loop filter may be configured to provide the first control signal to the frequency controlled oscillator. The phase locked loop may be operable in a calibration mode, in which: the modulation cancelling module does not remove the frequency modulation resulting from the second control input in the feedback path, and the second control input is based on an output of the loop filter.

The calibration mode may allow the phase locked loop to determine the second control input values for defining the relationship between the second control input and the amount of frequency modulation of the output signal arising therefrom.

The phase locked loop is operable in the calibration mode to determine each of the stored second control input values by successively locking the phase locked loop onto each frequency of the chirp using the second control input, and storing in the memory a value based on the second control input after each lock has been achieved.

The phase locked loop may comprise a temperature sensor. The phase locked loop may be configured to use the output of the temperature sensor to compensate for temperature variation in the response of the frequency controlled oscillator to the second control input.

For example, the memory may store a temperature associated with each stored second control input. A plurality of second control inputs for each desired frequency may be stored, each corresponding with a different temperature. This information may be used to determine an appropriate control value based both on the desired chirp frequency and the current temperature.

The time to digital converter may be according to the first aspect, and include any of the optional features thereof.

According to a fourth aspect, there is provided a proximity radar comprising a phase locked loop according to the second or third aspect.

According to a fifth aspect, there is provided a vehicle comprising the proximity radar according to the fourth aspect.

These and other aspects of the disclosure will be apparent from, and elucidated with reference to, the embodiments described hereinafter.

BRIEF DESCRIPTION OF DRAWINGS

Embodiments will be described, by way of example only, with reference to the drawings, in which.

Figure 1:
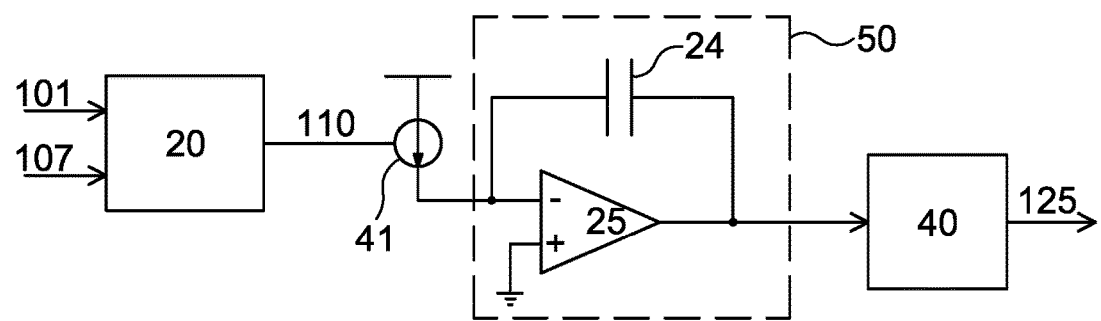
FIG. 1 is an outline circuit diagram of a TDC according to an embodiment.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Referring to FIG. 1, a time to digital converter 10 is shown, comprising a synchronisation block 20, charge pump 41, integrator 50 and successive approximation analog to digital converter (SAR ADC) 40.

The synchronisation block 20 is provided with a clock reference signal 101 and with an input signal 107. The synchronisation block 20 converts the time difference between cycles of the clock reference signal 101 and the input signal 107 into output pulses 110, with duration based on the time difference between respective cycles of the clock reference signal and input signal. Where the clock reference signal 101 and input signal 107 are digital signals, the synchronisation block 20 may provide an output pulse 110 with duration based on the timing difference between rising edges of the clock reference signal 101 and the input signal 107.

The output pulses 110 are provided to the charge pump 41. The charge pump 41 converts the output pulses 110 into an output current pulse 111 with duration substantially proportional to the time delay. The output current pulse from the charge pump 41 is input to the integrator 50, which integrates the charge on the capacitor 24. The integrator 50 comprises a transconductance amplifier 25 with feedback capacitance. The output voltage from the transconductance amplifier 25 depends on the integral of the current output from the charge pump 41 (i.e. the total charge output from the charge pump 41).

The output from the integrator 50 is provided to the SAR ADC 40, which converts the integrated charge on the capacitor 24 into a digital output value 125 by successive approximation (i.e. using a binary search approach, determining the most significant bit first, and successively approximating each bit in order of significance).

Figure 2:
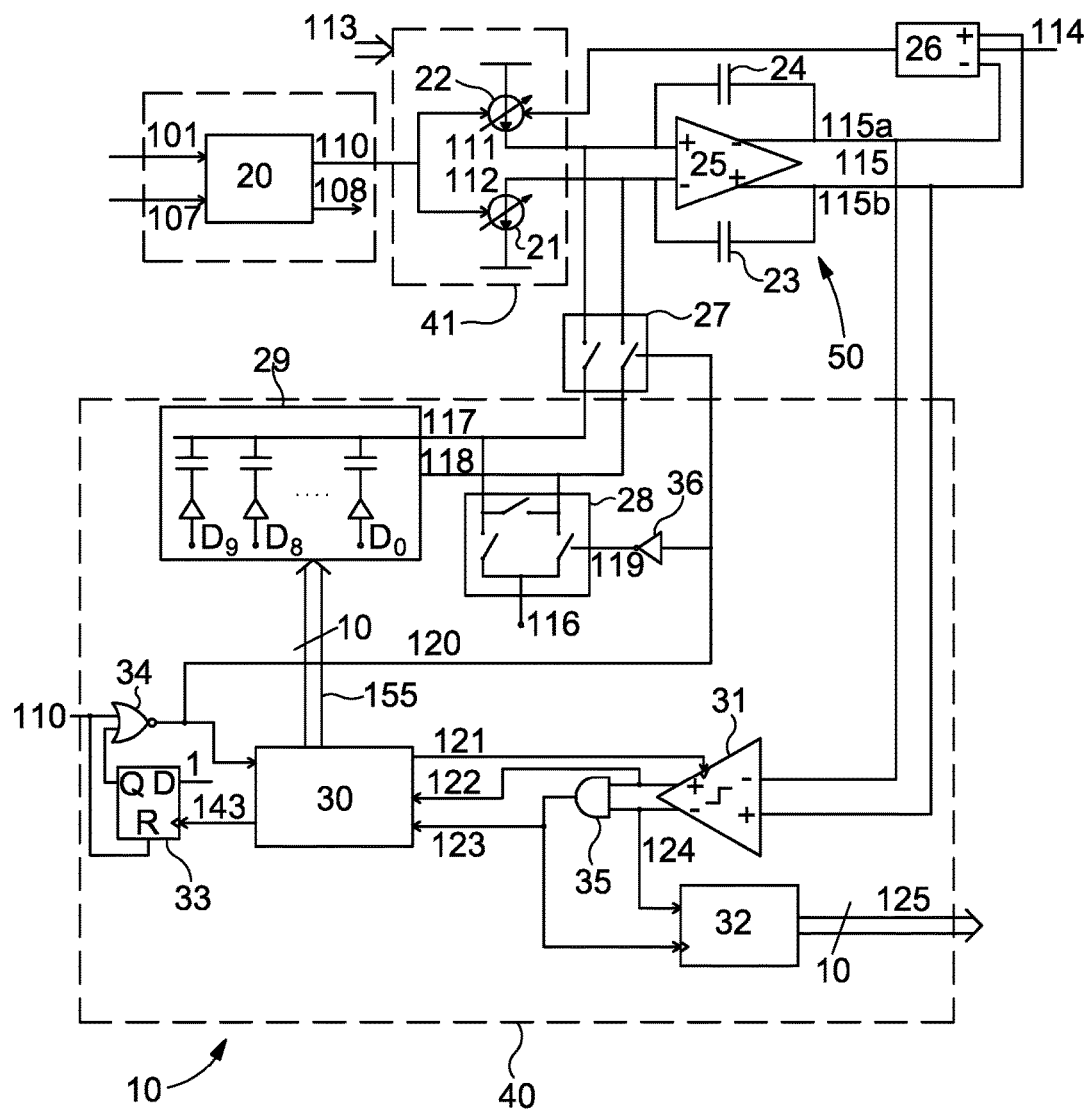
FIG. 2 is a circuit diagram of a TDC according to another embodiment.

Referring to FIG. 2, a more detailed example of a TDC 10 is shown, in which the integrator 50 comprises a differential arrangement, and in which more detail of an example architecture for the SAR ADC 40 is shown. The skilled person will appreciate that other implementations of the SAR ADC 40 and integrator 50 are possible, and that this example is merely illustrative.

In common with FIG. 1, the time to digital converter 10 comprises a synchronisation block 20, charge pump 41, integrator 50 and successive approximation analog to digital converter (SAR ADC) 40.

The charge pump 41 comprises a first current source 22 that is configured to output current pulse 111 and a second current source 21 that is configured to output current pulse 112. The current sources 21, 22 provide a current output when the output pulse 110 from the synchronisation block 20 is high, and no current output when the output pulse 110 is low. The current outputs 111, 112 of the charge pump 41 are respectively connected to non-inverting and inverting inputs of a transconductance amplifier 25 of the integrator 50. The charge pump 41 is operable to enable the amplitude of the output of the current pulses 111, 112 from each individual current source 21, 22 to be varied in response to an input charge pump control signal 113. This allows the resolution of the TDC 10 to be selectable, as will be explained in more detail below with reference to FIG. 8. The charge pump control signal 113 may be a digital signal.

The transconductance amplifier 25 comprises an inverting output 115a and a non-inverting output 115b. The difference between the inverting and non-inverting outputs 115a, 115b is the integrator output voltage 115. A first integrating capacitor 24 is connected between the inverting output 115a and the non-inverting input of the transconductance amplifier 25 and a second integrating capacitor 23 is connected between the non-inverting output 115b and the inverting input of the transconductance amplifier 25.

The current pulses 111 and 112 are integrated by the transconductance amplifier 25 as charges on integrating capacitors 23 and 24 respectively. Charge on integrating capacitor 23 results in an output voltage 115b of opposite polarity to the output voltage 115a resulting from charge on integrating capacitor 24. The integrator output voltage output 115 from the transconductance amplifier is the differential of the output voltages 115a and 115b.

A common mode voltage 114 at the integrator outputs 115a, 115b is controlled by a common-mode feedback block 26. The common mode feedback block 26 determines whether a common mode voltage is present at the differential outputs 115a, 115b of the transconductance amplifier. A common mode voltage indicates an imbalance in the amplitude of the charge output from current sources 22, 21 (and/or between the capacitors 23, 24). The common-mode feedback block 26 acts to cancel any imbalance by varying the output current from one of the current sources 22, 21, based on the common mode voltage at the differential outputs of the integrator 50. In this example, the common-mode feedback block 26 is varying the amplitude of the output of the first current source 22, but in other embodiments the output of the second current source 21 may be varied to reject a common mode voltage at differential outputs of the integrator 50 (so as to balance the negative and positive sides of the integrator 50).

The SAR ADC 40 comprises: comparator 31, AND gate 35, control logic 30, flip-flop 33, XOR gate 33, DAC 29 and shift register 32. A second switch 27 is provided, configured to control connection of the DAC 29 with the inputs of the transconductance amplifier 25. A first switch 28 is provided, configured to provide a common mode voltage 116 to the inputs of the transconductance amplifier 25 and to the DAC 29 during resetting.

The integrator output voltage 115 is provided to the comparator 31 (which is a 1-bit comparator) of the successive approximation register 40. Specifically, the inverting output 115a is provided to a inverting input of the comparator 31 and the non-inverting output 115b is provided to an non-inverting input of the comparator 31. The comparator 31 provides a high output from the non-inverting output 122 when voltage 115b is lower than voltage 115a (i.e. when the output voltage 115 is positive) and a low output from the non-inverting output when voltage 115a is lower than voltage 155b (i.e. when output voltage 115 is negative).

The inverting and non-inverting outputs 124, 122 of the comparator 31 are connected to AND gate 35, which outputs a comparator ready signal 123 (active low). Since the comparator 31 is a clocked comparator, both outputs will be high when the clock signal 121 that is provided to the comparator is low. When the comparator reader signal 123 is high, the comparator is inactive. The non-inverting output 122 is provided to control logic block 30.

The control logic block 30 controls the DAC 29, provides the clock signal 121 to the comparator 31, and controls the switching of the first and second switches 28, 27. The control logic 30 may be asynchronous with the clock reference signal 101 and input signal 107. The control logic 30 provides a digital input 155 to the DAC 29. The DAC 29 comprises a first switched capacitor bank (not shown in FIG. 1), which provides a current 118 based on the digital input 115, and a second switched capacitor bank, which provides a current 117 based on the digital input 155.

The output 118 from the first DAC bank is connected to the inverting input of the transconductance amplifier 25 via the second switch 27 and the output 117 from the second DAC bank is connected to the non-inverting input of the transconductance amplifier 25 via the second switch 27. Connecting the first and second and DAC banks to the integrator capacitors 24, 23 varies the voltage on the first integrator capacitor 24 and the second integrator capacitor 23 by an amount based on the digital input 155 to the DAC 29.

The currents 117 and 118 are respectively caused by redistribution of charge from the integrator capacitors 24 and 23 onto the respective switched capacitor DAC bank. The control logic 30 is configured to search for a configuration of each DAC bank that causes just enough current to flow from (or to) the integrator capacitors 23, 24 to reduce the output 115 of the integrator to within less than a least significant bit of zero. The sequence of switching the capacitors of the DAC banks will be described below in more detail with reference to FIGS. 4, 5 and 6.

Figure 3:
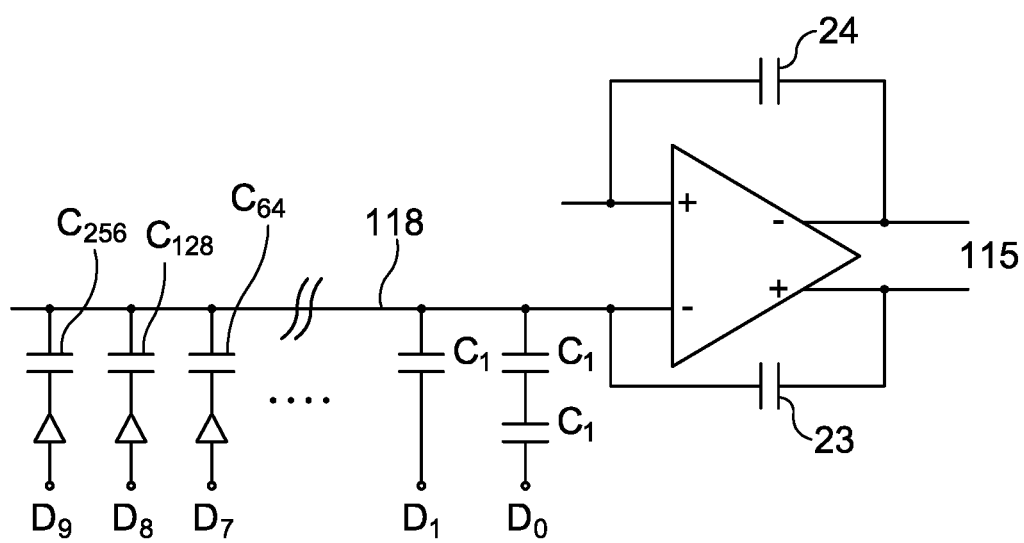
FIG. 3 is circuit diagram of a DAC of the TDC of FIG. 2.

Referring to FIG. 3, a schematic of the first bank of the DAC 29 is shown (with the second switch 27 omitted). The second bank of the DAC 29 is similar, as shown in FIG. 1. Each bank of the DAC 29 comprises a switched capacitor network of parallel capacitances. In this example embodiment the DAC has 10 bits of resolution (but other resolutions are contemplated, e.g. from 2 bit to 24 bit). One electrode of each effective capacitance of the network is connected at one end to an output rail 118, and at the other end to an input corresponding with a bit of the digital input 155. Buffers may be used to drive the larger capacitors (e.g. C256). The effective capacitance connected to each bit of the digital inputs (D0 to D9) is doubled with each bit, so that the effective capacitance connected to the least significant bit (LSB) D0 is a factor of 512 less than the effective capacitance connected to the most significant bit (MSB) D9. In this embodiment the capacitance connected to the least significant bit comprises a series combination of capacitors C1 with capacitance equal to one nominal unit, thereby providing an effective capacitance of C0.5. The capacitor C256 connected to the most significant bit D9 has a capacitance of 256 times the nominal unit of capacitance. The current flowing to or from the DAC from the integrator capacitor 23 is therefore controlled by the digital input 155, which sets the voltages on one electrode of each capacitor C1 to C256 to high or low.

Returning to FIG. 2, the shift register 32 is configured to read and store the output 125 of the SAR ADC. The shift register 32 receives an output from the comparator 31, in this embodiment the inverting output 124. In other embodiments the shift register 32 may receive the non-inverting output 122 from the comparator 31. The value of the output of the comparator 31 corresponds with whether the current bit under test should be a 0 or a 1 in the output from the SAR ADC 40 (as will be explained in more detail with reference to FIGS. 5 and 6). The shift register 32 stores the value of the current bit (0 or 1), and then shifts the value in the register 32 in response to a clock input based on the comparator ready signal 123, ready to receive the next bit value.

The flip-flop 33 and XOR gate 34 are configured to control the first switch 28 and second switches 27, based on the output pulse from the synchronisation block 20 and a ready signal 143 from the control logic 30 indicating that the successive approximation cycle for the present cycle has completed. The input signal 110 is connected to the reset input of the (D-type) flip-flop 33, and the Q output from the flip-flop 33 is connected to an input of the XOR gate 34. The D input of the flip-flop is set to 1. The other input of the XOR gate 34 is connected to the output pulse 110 from the synchronisation block 20. The switch control output 120 of the XOR gate 34 controls the operation of the first and second switch 28, 27, and is used to reset the control logic 30. The control logic 30 is triggered to reset the SAR ADC 40 when the output from the XOR gates 34 goes low. The switch control 120 therefore controls the connection between the DAC 29 and the integrator capacitors 24, 25, and the connection between the DAC 29 and the common mode voltage input 116.

When switch control 120 is high, the DAC banks are connected to the capacitors 24, 25 of the integrator 50. When the switch control 120 is low, the DAC banks are reset by connecting them to the common mode voltage input 116. The SAR ADC 40 is thereby configured to reset the DAC 29 at the end of the successive approximation cycle provided that the current pulse 110 is low. At the end of the cycle the timing of the switching is:

the first switch 28 switches on and connects the inputs of the transconductance amplifier 25 to a common mode supply 116, creating a low impedance path for channel charge from the first switch when the second switch turns off;

the second switch 27 turns off, disconnecting the DAC 29 from the integrator;

the DAC 29 is reset.

The TDC 10 may be configured such that the charge on the integrator 50 following the successive approximation cycle is not reset, but is left in place. This leaves an amount of charge that is less than the least significant bit on the integrator 50, which has the effect of dithering the quantisation levels of the SAR ADC 40, thereby providing for advantageous quantisation noise shaping and facilitating subsequent quantisation noise cancellation (for example by low pass filtering). Retaining the residual charge on the integrator 50 after successive approximation may thereby improve the performance of a phase locked loop comprising a SAR TDC 10 according to an embodiment.

Figure 4:
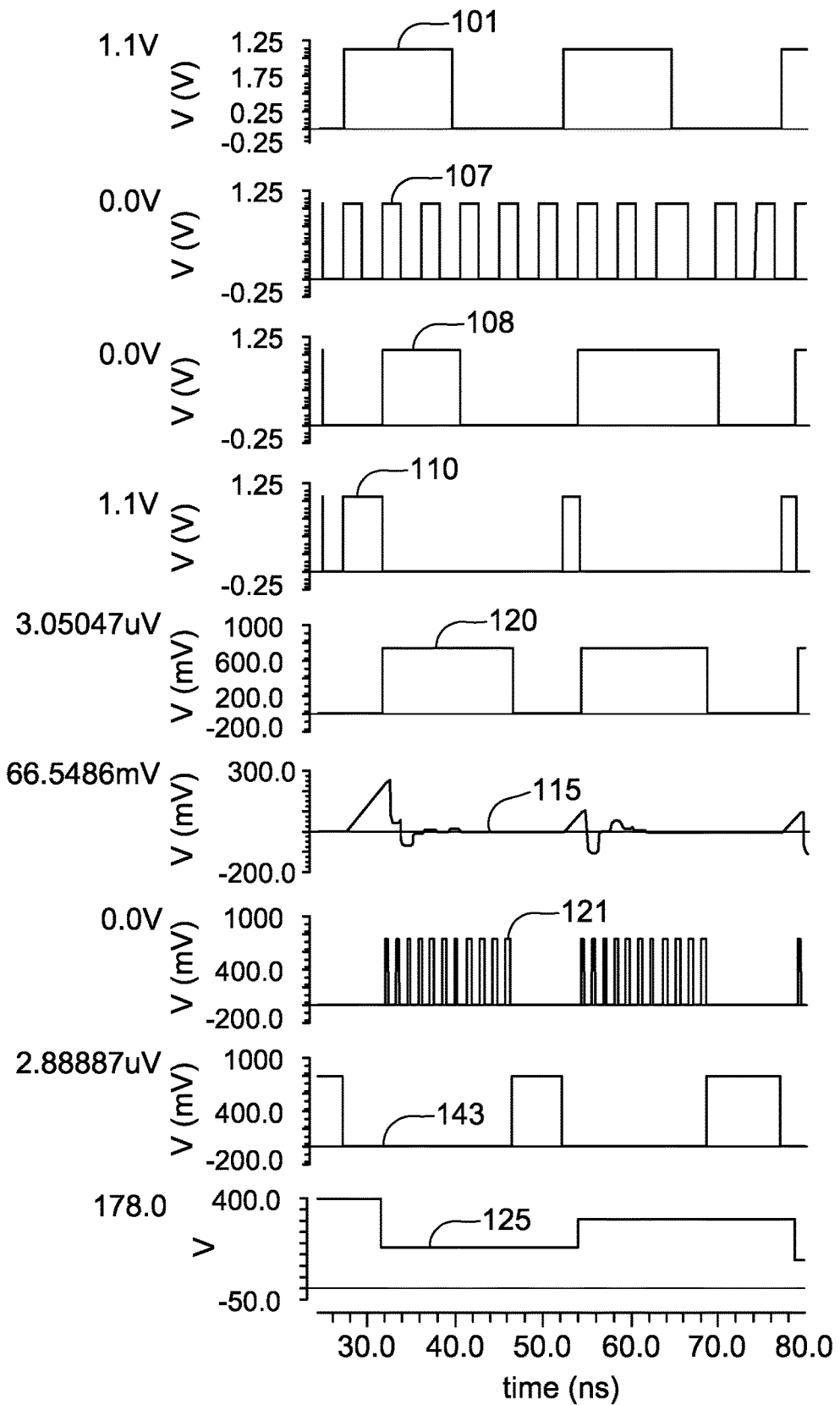
FIG. 4 illustrates the voltages at various locations in the TDC of FIG. 2 during operation.

The operation of the SAR TDC 10 is illustrated by the waveforms shown in FIG. 4. FIG. 4 shows (from top to bottom), the clock reference input 101, the input signal 107, the re-clocked reference signal 108, the output pulse 110 (from the charge pump 41), the switch control 120, the integrator voltage output 115, the comparator clock 121, the (control logic) ready 143 and the SAR ADC output value 125.

The clock reference input 101 is a square wave, and is not in phase with the input signal 107. The frequency of the input signal 107 in this example is a multiple of the clock reference frequency. The re-clocked reference signal 108 is at the same frequency as the clock reference input, but the edges are re-clocked by synchronisation block 20 using the input signal 107. The output pulse 110 from the synchronisation block 20 is high during the time between a leading edge of the clock reference input 101 and the next leading edge of the input signal 107. The integral of the voltage of each pulse 110 from the synchronisation block 20 therefore corresponds with the time delay (or phase difference) between the corresponding cycles of the clock reference 101 and input 107. The charge pump 41 converts this voltage pulse into a current pulse that charges the integrator capacitors 23, 24, integrating the current pulse. This charging of the integrator capacitors 23, 24 can be seen in the integrator voltage output 115 waveform. When the output pulse waveform 110 is high, current is being integrated on the capacitors 23, 24, increasing the voltage output 115 from the integrator (in proportion to the amplitude of the current supplied by the charge pump 41 and the duration of the pulse). Changing the amplitude of the current output from the charge pump 41 will change the rate of charging of the capacitors 23, 24 of the integrator 50, which will have the effect of varying the timing value associated with each bit of the DAC 30. Varying the current amplitude from the charge pump 41 therefore provides selectable resolution of the SAR TDC 10, with a concomitant trade-off in the full scale range of the DAC 30, which affects the maximum time delay that can be approximated by the SAR ADC 40 in a single conversion cycle.

The SAR TDC 10 may include a gain normalisation block (not shown) that normalises the digital output 125 from the SAR TDC 10 to provide a normalised SAR TDC output that corresponds with the time delay. The gain normalisation block may compensate for changes in the amplitude of the output current from the charge pump 41.

Once the integrator capacitors 23, 24 are finishing charging (when the output pulse 110 goes low), the switch control 120 connects the DAC banks to the inputs of the integrator 50, and the control logic 30 determines the digital settings for the DAC 29 that reduce the voltage output from the integrator 50 to within a least significant bit (or less) of zero.

In each conversion cycle the control logic 30 may start with the MSB D9 high, so as to reduce the charge on the capacitors 23, 24 by an amount corresponding with the MSB when the DAC 29 is connected by the second switch 27 to the integrator inputs.

Figure 5:
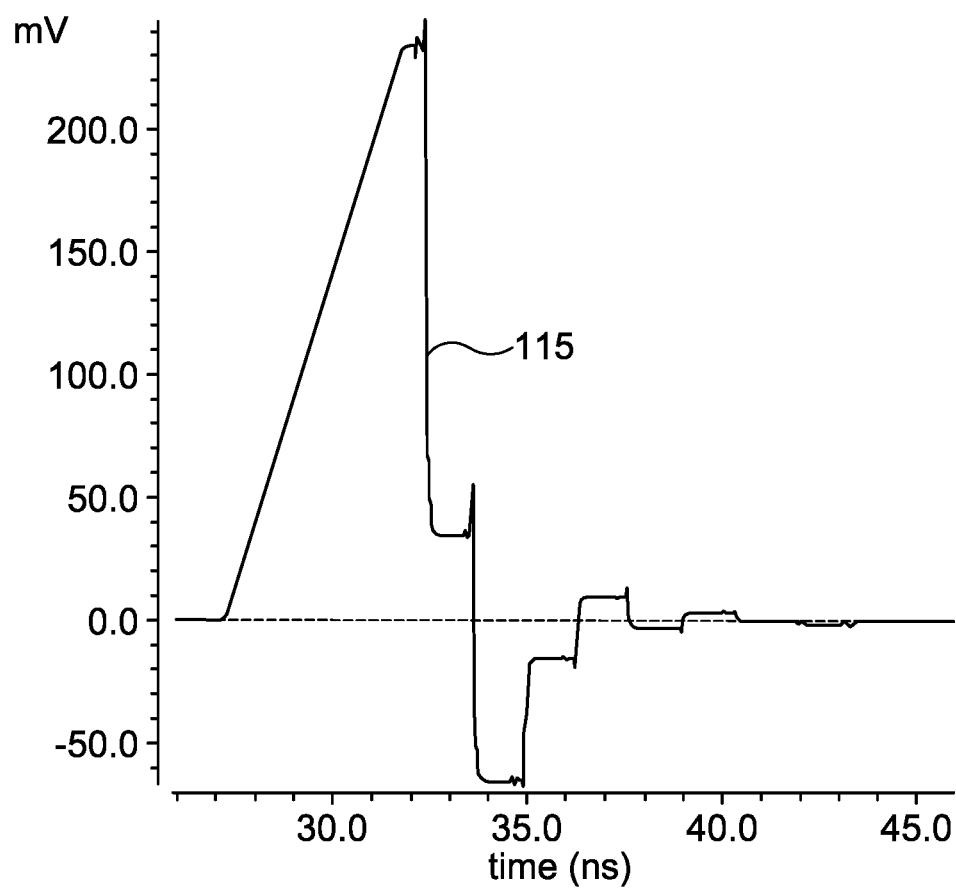
FIG. 5 illustrates in more detail the voltage output from the integrator of a TDC according to the embodiment of FIG. 2.

The first conversion cycle of FIG. 4 (at approximately 32 to 45 ns), is shown more clearly in FIG. 5. Following switching of the second switch 27 to connect the DAC 29 to the integrator inputs, the output of the integrator 50 settles (to around 35 mV). The comparator 31 is provided with a clock signal 120, which results in the comparator 31 providing a signal 122 to the control logic 30 that indicates whether the output 115 from the integrator is positive. In the case of the first conversion cycle the output 115 is still positive following this, so the next most significant bit D8 is switched high by the control logic 30. In the case of the first conversion cycle, this results in enough current flow to swing the integrator output 115 negative (to approximately −65 mV). In the next step the control logic 30 switches bit D8 low, at the same as switching D7 high. This saves a step in the conversion cycle (which would otherwise be incurred if D8 was switched low without at the same time switching D7 high). Although advantageous in improving the speed of conversion, this returning of the previous bit at the same time as switching the present bit is not essential. The control logic 30 is configured to successively test each bit (D9 to D0) of the DAC 29 against the charge on the integrator capacitors 24, 23 which will reduce the output of the integrator 50 to an amount representing the least significant bit of the DAC 29 (or less). When the control logic 30 has completed the successive approximation cycle, it is configured to output ready signal 143, which indicates that switch control 120 can toggle the first and second switches 28, 27 so as to reset the DAC 29 ready for another conversion cycle. The value from the SAR ADC register 125 for the preceding conversion cycle is available on the next edge of the re-clocked reference signal 108.

Figure 6:
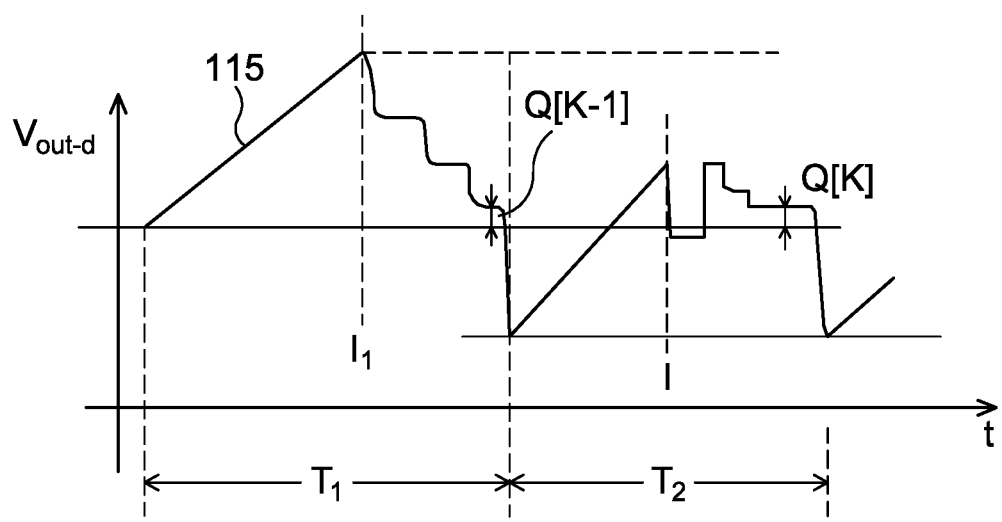
FIG. 6 illustrates a pair of cycles of the voltage output from the integrator of a TDC according to an embodiment.

Referring to FIG. 6, a method of increasing the dynamic range of the SAR ADC 40 is shown. The control logic 30 may be configured to implement this method. According to an embodiment, at the end of the conversion cycle the integrator 50 may be disconnected from the DAC 29 (e.g. using the second switch 27) and the MSB of the DAC 29 reset to 0. The integrator 50 may then be re-connected to the DAC 29 (e.g. via switch 27) and the MSB bit switched to 1, thereby reducing the output from the integrator 50 by an amount associated with the MSB before the conversion cycle begins. The integrator 50 is thereby effectively negatively pre-charged (relative to the charge input from the charge pump 41). In FIG. 6 this MSB negative pre-charge has been applied at the end of the first conversion cycle T1.

Figure 7:
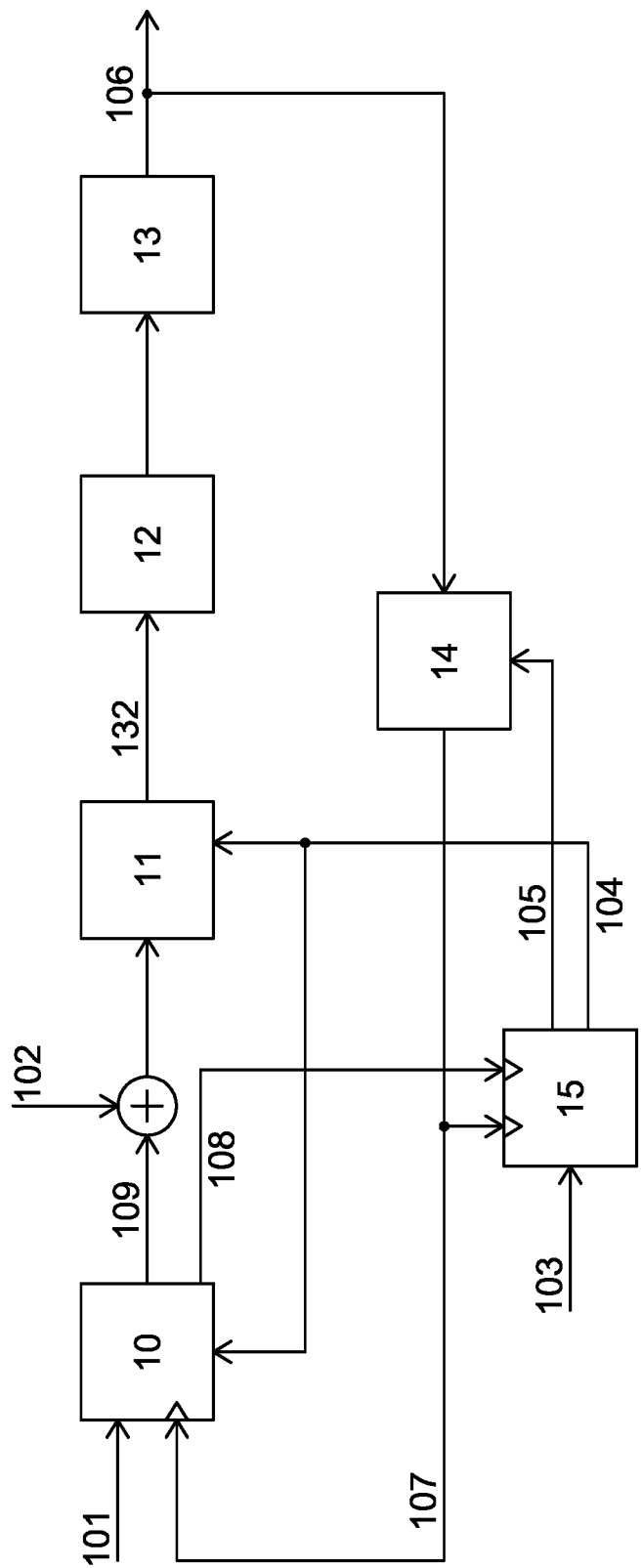
FIG. 7 is a block diagram of a phase locked loop comprising a TDC according to an embodiment.

Embodiments of the SAR TDC 10 are particularly useful in phase locked loops. FIG. 7 shows an all-digital phase locked loop (ADPLL) including a SAR TDC 10 according to an embodiment.

The ADPLL comprises the SAR TDC 10, a quantisation noise cancelling block 11, a digital loop filter 12, digitally controlled oscillator 13 (DCO), frequency divider 14, divider control 15.

A clock reference input 101 and an input signal 107 is provided to the SAR TDC 10. The SAR TDC determines the time difference between the clock reference input 101 and the input signal 107. The input signal 107 is the output from the frequency divider 14. The frequency divider 14 receives the DCO 13 output 106 (which is the output of the phase locked loop) and divides the frequency thereof, so that a relatively low frequency reference clock input 101 may be used to generate a relatively high frequency output signal 106 with precision. The frequency divider 14 is controlled by the divider control block 15, which may comprise a sigma-delta modulator, so that the divider 14 and control block 15 together provide for fractional frequency dividing (as is known in the art).

The divider control block 15 provides a divider value 105 to the divider block 14 and an accumulated sigma-delta error 104 to the quantisation noise cancelling block 11. The divider control block 15 is configured to receive a normalised tuning word (NTW) 103, and then to control the divider block 14 to provide the desired output frequency from the ADPLL (with reference to the reference clock 101). The divider control block 15 receives the re-clocked reference signal 108 from the SAR TDC 10 and the frequency divided DCO signal output by the divider block 14.

A normalised SAR TDC output 109 from the SAR TDC 10 is provided to the quantisation noise cancelled block 11, after the addition of a phase offset signal 102. The quantisation noise cancelling block 11 is configured to reduce divider quantisation noise. The quantisation noise cancelling block 11 may be configured to cancel or reduce noise in the digital domain.

The output 132 of the quantisation noise cancelling block 11 is the phase error 132, which is provided to the digital loop filter 12. The digital loop filter 12 is configured to convert the phase error input signal 132 into a digital output for controlling the DCO 13 so as to minimise the phase error 132.

Figure 8:
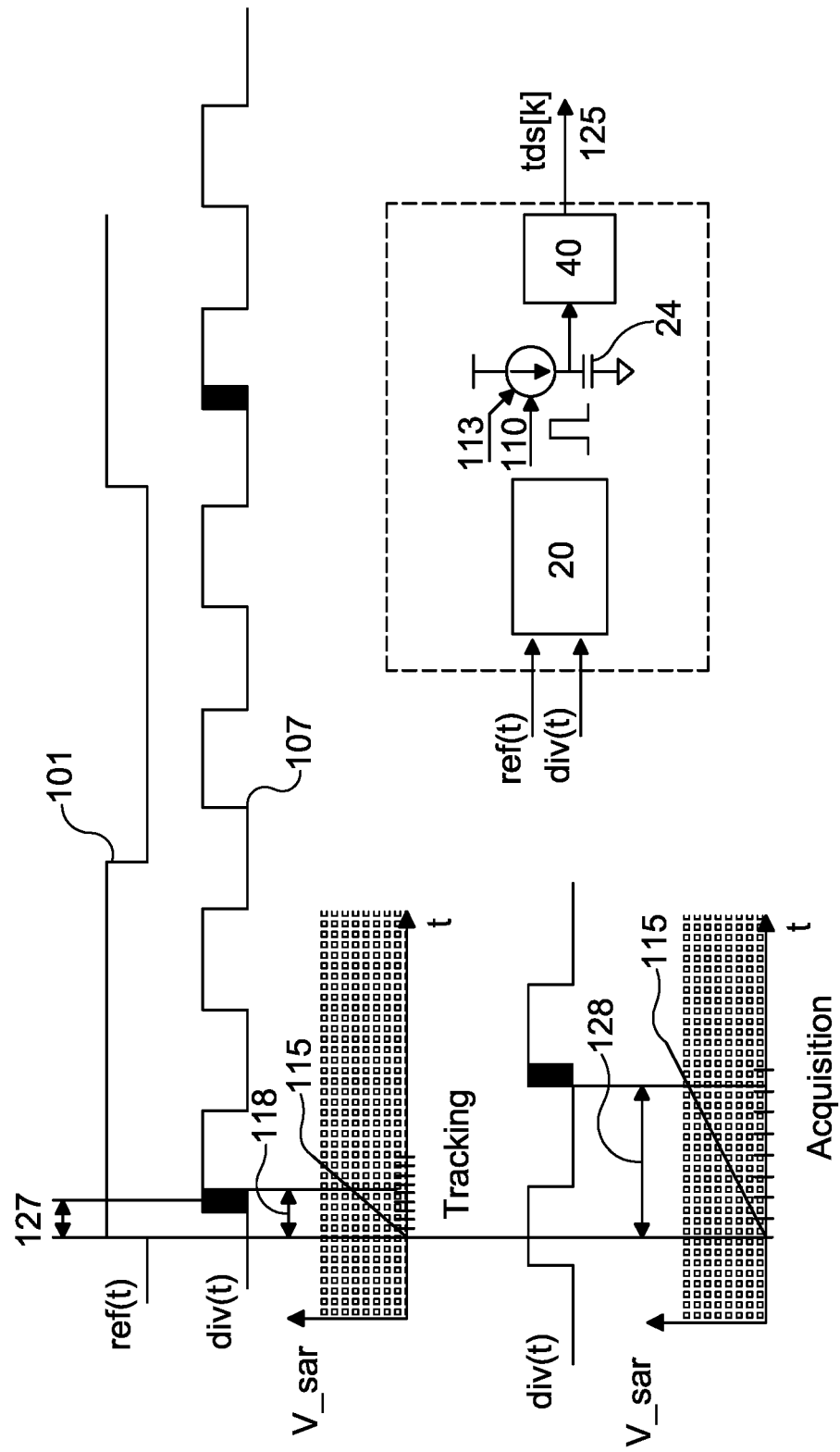
FIG. 8 illustrates the operation of a time to digital converter according to an embodiment in a phase locking mode and a phase locked mode.

FIG. 8 illustrates the operation of the ADPLL of FIG. 7 with reference to the variable current amplitude modes of operation of the charge pump 41. In some embodiments, the SAR TDC 10 may be operated in a first mode (tracking mode), having a first current source current output amplitude and a second mode (acquisition mode), having a second, smaller charge pump output current amplitude. In the first mode, the timing resolution of the SAR TDC 10 is greater, because each bit of charge moved by the ADC 29 corresponds with a smaller increment of time. This is accompanied by a corresponding reduction in the full scale time difference value of the SAR TDC 10. As the phase error during the tracking mode is small the SAR ADC 40 will not saturate (it is able to cancel the integrated current). In the second mode, the timing resolution of the SAR TDC 10 is lower but the full scale time difference that can be quantised by the SAR ADC 40 is larger. The second mode is therefore more suitable for acquiring phase lock, and the first mode is more suitable for tracking, once phase lock has been achieved.

Figure 9:
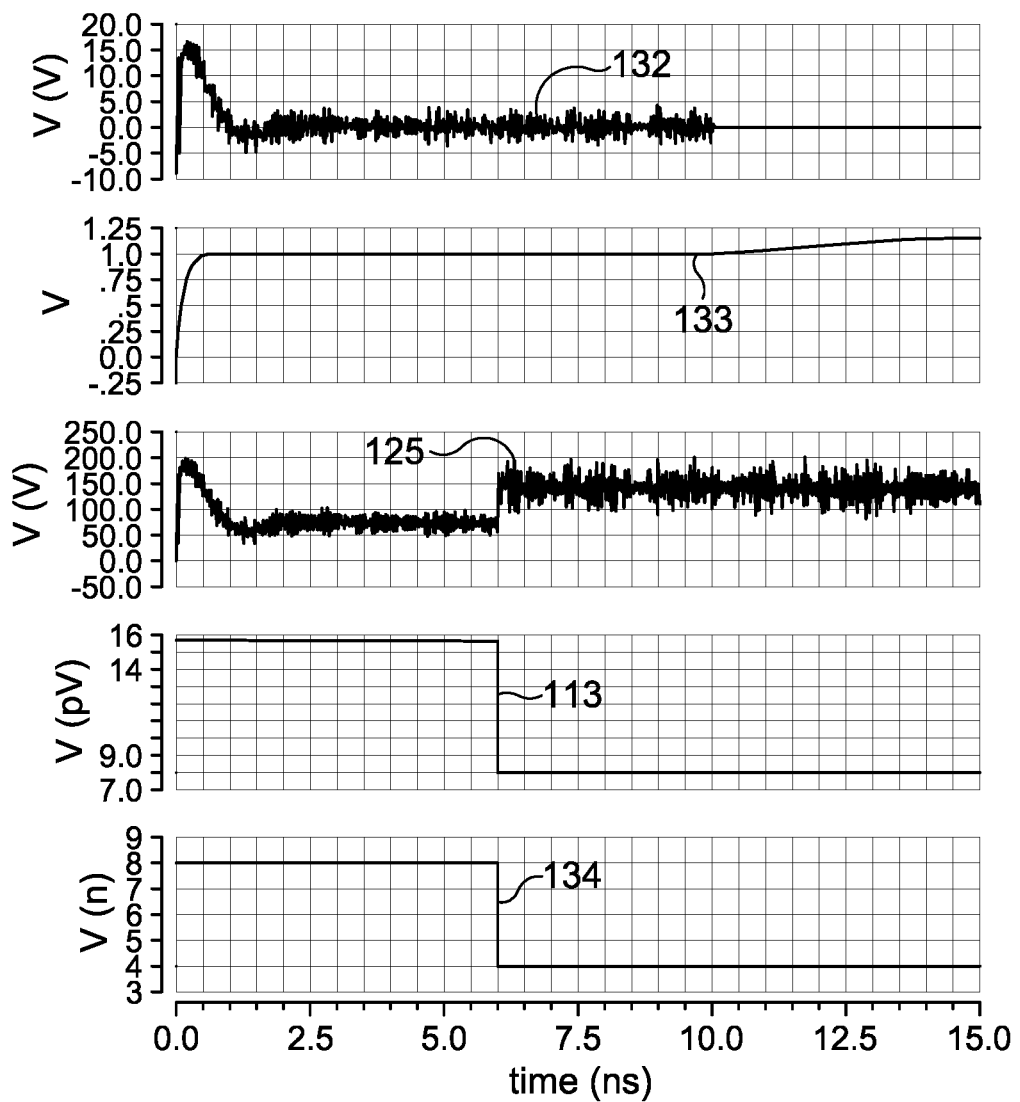
FIG. 9 is a graph of the voltages at various locations in a phase locked loop according to an embodiment, showing a switching between a first mode, in which a first current amplitude is output from the charge pump of the time to digital converter, and a second mode in which a smaller current amplitude is output from the charge pump.

Referring to FIG. 9, this dual mode SAR ADC operation in a phase locked loop according to FIGS. 7 and 8 is shown. FIG. 9 shows a phase error 132, a quantisation noise cancelling filter value 133, the SAR TDC output value 125 (without normalisation to compensate for changes in the charge pump output current), the charge pump control signal 113 and the SAR scale factor value 134. The SAR scale factor value 134 is used to normalise the output of the SAR TDC 10 to provide a signal that indicates the time delay (independent of the charge pump current).

At t=0 in FIG. 9, the ADPLL is acquiring phase lock on the reference signal, and the SAR TDC 10 is accordingly operating in the second (acquisition) mode, in which the charge pump current is relatively low. At t=6 μs, following settling of the phase error 132, the SAR TDC 10 is switched to the first (tracking) mode, by changing the value of the charge pump control signal 113, increasing the charge pump current. This results in a step change in the raw output from the SAR TDC 125, which is compensated for by a change in the SAR scale factor value 134. The increased resolution of the SAR TDC 10 in the first mode results in reduced phase errors 132 from t=10 ms onwards, after the ADPLL has settled in the first mode. The ability to tune the operation of the SAR TDC 10 optimise the speed of tracking and the resolution allows an ADPLL to be produced with low noise and large bandwidth. Although two modes are described above by way of example, more modes are possible, as is a continuous variation of the charging current in accordance with algorithmic rules.

Figure 10:
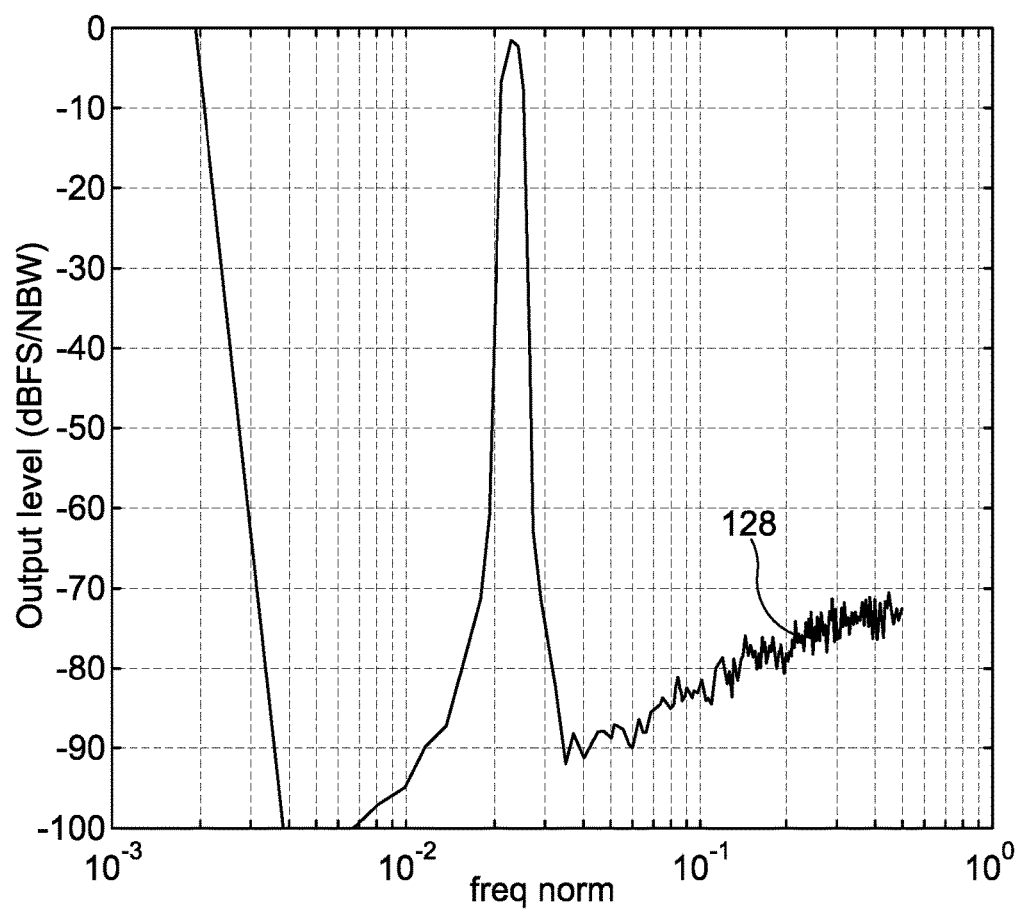
FIG. 10 is a plot of the quantisation noise of a time to digital converter according to an embodiment, in which the charge pump current Icp=30 μA, reference frequency Fref=40 MHz, full scale output of the time to digital converter TDC_FS=3.6 ns, the time resolution of the TDC tres=11.4 ps, and the noise bandwidth NBW=0.00292.

FIG. 10 shows an example of quantisation noise from a SAR TDC 10 according to an embodiment. The noise is plotted in dB relative to a full scale per noise bin (per noise resolution bandwidth (NBW)). The NBW for the graph is 0.00293. In this example the charge pump current is 30 μA, the reference frequency input is 40 MHz, full scale output from the SAR TDC corresponds with a 3.6 ns time delay, and the resolution of the SAR TDC is 11.4 ps. The SAR TDC quantisation noise 128 at high offset frequencies can be suppressed below a typical frequency controlled oscillator thermal noise by an appropriate digital loop filter. According to an embodiment, a high resolution TDC with low noise is therefore provided.

Figure 11:
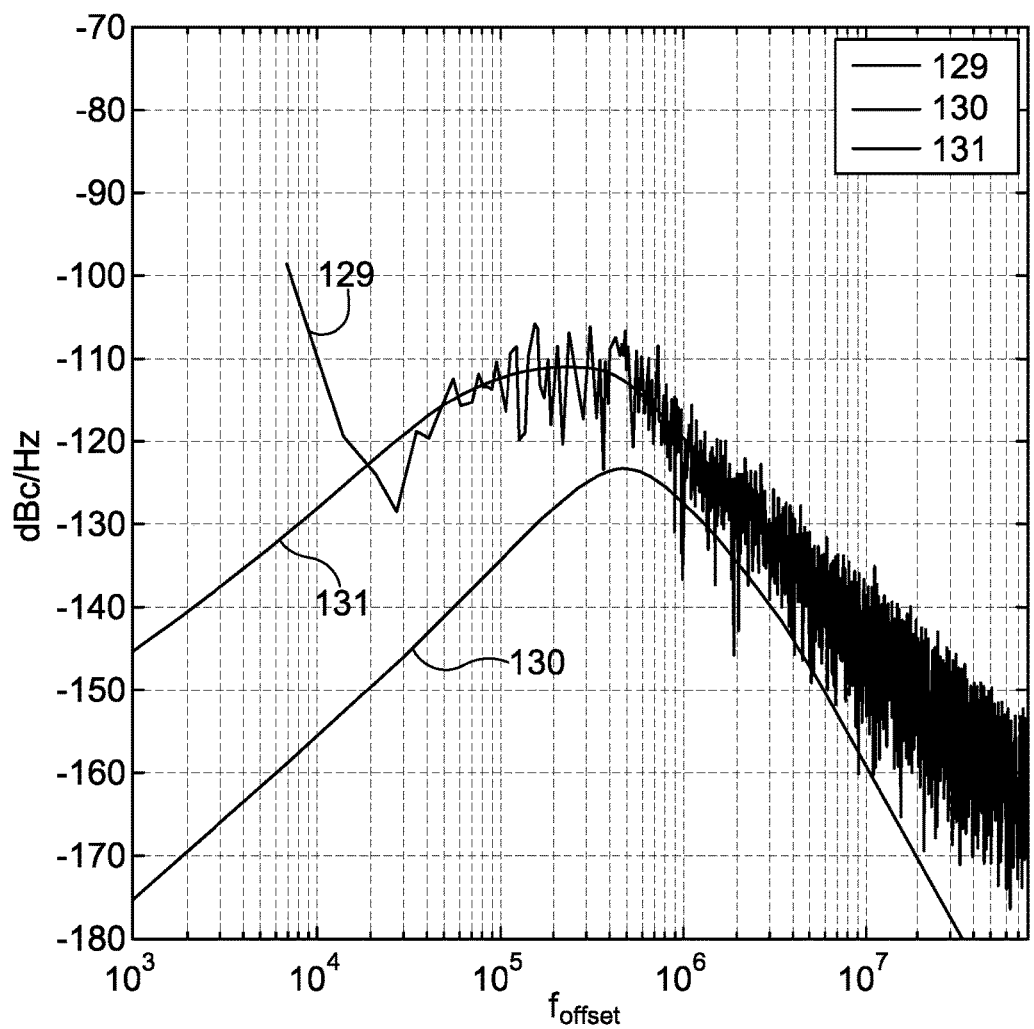
FIG. 11 is a plot comparing noise, in a phase locked loop, originating from the TDC and from a voltage controlled oscillator, for an output frequency of 4.665 GHz with a resolution bandwidth of 38.35 dB.

FIG. 11 illustrates the phase noise performance of a SAR TDC 10 according to an embodiment in a phase locked loop according to FIG. 7. SAR TDC quantisation noise 130 is shown with expected voltage controlled oscillator noise 131, and a simulation of VCO phase noise 129 that includes flicker noise. In FIG. 11 the VCO frequency is 4.665 GHz and the resolution bandwidth is 38.35 dB (with the noise plotted in dBc/Hz). The SAR TDC quantisation 130 is well below the noise of the VCO 129, 131 throughout the range of frequency offsets shown.

Figure 12:
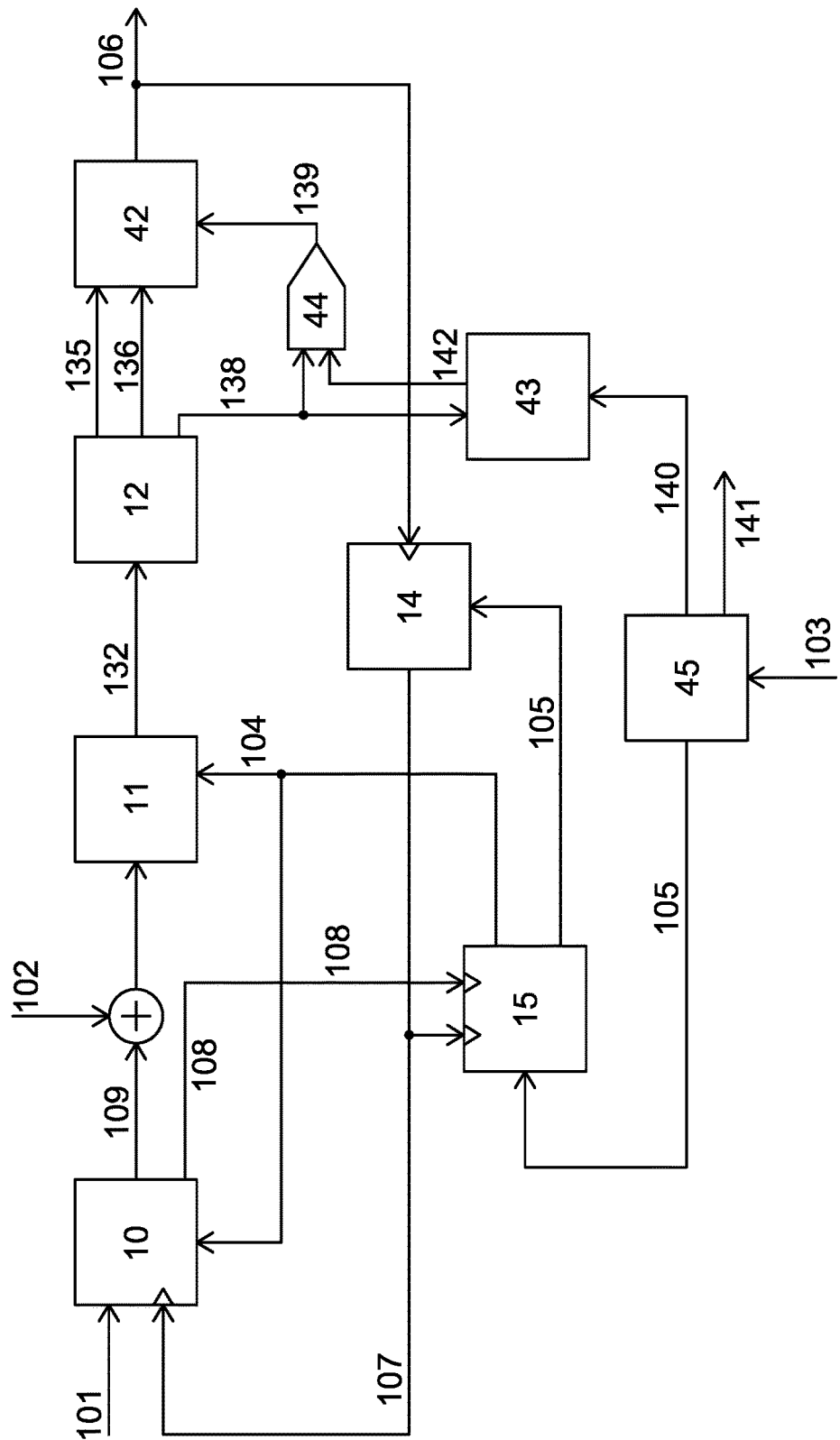
FIG. 12 is a block diagram of a phase locked loop according to a further embodiment.

FIG. 12 shows a phase locked loop according to an embodiment, comprising a time to digital converter (TDC) 10, quantisation noise cancelling block 11, digital loop filter 12, frequency controlled oscillator 42, frequency divider 14, divider control 15, chirp control block 45, look up table 43 and digital to analog converter (DAC) 44.

In common with the PLL architecture of FIG. 7, a clock reference input 101 and an input signal 107 is provided to the TDC 10. The TDC 10 may be a SAR TDC as described above, but this is not essential and any TDC architecture may be used. The TDC 10 determines the time difference between the clock reference input 101 and the input signal 107. The input signal 107 is the output from the frequency divider 14. The frequency divider 14 receives the frequency controlled oscillator 42 output 106 (which is the output of the phase locked loop) and divides the frequency thereof, so that a relatively low frequency reference clock input 101 may be used to generate a relatively high frequency output signal 106 with precision. The frequency divider 14 is controlled by the divider control block 15, which may comprise a sigma-delta modulator, so that the divider 14 and control block 15 together provide for fractional frequency dividing (as is known in the art).

The divider control block 15 provides a divider value 105 to the divider block 14 and an accumulated sigma-delta error 104 to the quantisation noise cancelling block 11. The divider control block 15 is configured to receive the divider value from the chirp control block 45. The divider control block 15 receives the re-clocked reference signal 108 from the SAR TDC 10 and the frequency divided DCO signal output by the divider block 14.

The chirp control block 45 receives a normalised tuning word (NTW) 103 and controls the operation of the divider control block 15 and the operating mode of the phase locked loop, as will be explained in more detail below.

A normalised TDC output 109 from the TDC 10 is provided to the quantisation noise cancelled block 11, after the addition of a phase offset signal 102. The quantisation noise cancelling block 11 is configured to reduce divider quantisation noise. The quantisation noise cancelling block 11 may be configured to cancel or reduce noise in the digital domain.

The output 132 of the quantisation noise cancelling block 11 is the phase error 132, which is provided to the digital loop filter 12. The digital loop filter 12 is configured to convert the phase error input signal 132 into a digital output for controlling the frequency controlled oscillator 42 so as to minimise the phase error 132.

The frequency controlled oscillator 42 has a first control input, comprising a tracking input 135 and an acquisition input 136 and a second control input 139 (or frequency modulation input). The first control input comprises digital inputs. Each of the tracking input 135 and acquisition input 136 may be associated with a switched capacitor varactor bank, which are used to vary the frequency of the oscillator 42. The second control input 139 is an analog input, and is associated with an analog varactor. The use of an analog varactor allows filtering of quantisation noise prior to this control input, which improves the linearity of a chirp produced using the phase locked loop.

The DAC 44 is connected to the second control input 139 of the frequency controlled oscillator 42. The DAC receives a digital input 142, 138 from the look up table 43 or digital loop filter 12.

The chirp generator 45 is configured to control the operation of the phase locked loop, providing the divider value 105 to the divider control block 15, a frequency modulation control signal 140 to the look up table and a chirp window output signal 141. The chirp generator 45 is configured to control the phase locked loop in response to a normalised tuning word 103 input.

The look up table (LUT) 43 is configured to receive the frequency modulation control signal 140 from the chirp generator 45. The LUT 43 is further configured to receive an output 138 from the loop filter 12 and to provide a digital output 142 to the DAC 44 so as to provide the second control input 139 to the frequency controlled oscillator 42. The LUT 43 comprises a memory for storing digital control values and, optionally, an associated chirp frequency value.

In a first (calibration) mode, the phase locked loop is configured not to remove the effect of the second control input 139 on the output 106 from the frequency controlled oscillator 42 in the feedback path to the TDC 10. In this mode the DAC 44 is responsive to the output 138 of the loop filter 12. The phase locked loop is thereby operable to lock to each desired frequency of a chirp by varying the second control input 139. The chirp control block 45 varies the divider value 105 to set the desired frequency, and the second control input 139 is varied by the feedback path until the desired frequency is obtained (when the phase is locked). In the calibration mode, the phase locked loop has a large bandwidth, reducing locking time for each value of the calibration.

The LUT 43 receives the digital control value 138 that corresponds with each desired chirp frequency, and stores the value. The LUT 32 thereby stores in a memory a list of digital control values that correspond with each desired chirp frequency. The digital control values compensate for any non-linearity in the response of the frequency controlled oscillator 42 to the second control input 139.

In a second (chirp) mode, the DAC 44 is responsive to the digital output 142 from the LUT 43. The LUT 43 receives a frequency modulation control signal 140 from the chirp control block 45 corresponding with a desired chirp frequency, and outputs a digital signal 142 determined with reference to the list of digital control values in the memory. For instance, if the desired frequency corresponds exactly with one of the calibration frequencies, the stored value may be used directly. Interpolation (e.g. linear, cubic, spline, polynomial etc) may be used to determine digital control values 142 for intermediate desired frequencies 140 that do not correspond exactly with calibration frequencies of control values stored in the LUT memory.

In the second mode, the chirp control block 45 provides a divider value 105 to the divider control block 15 that removes the effect of the second control input 139 of the frequency controlled oscillator 42. In this way, the first control input 135, 136 of the frequency controlled oscillator 42 maintains lock during rapid frequency sweeps, while compensating for any distortion caused by non-linearity. The feed-forward control based on stored values from a calibration of the response of the oscillator 42 to the second control input 139 means that the frequency chirp is highly linear and accurate.

During chirp mode, the bandwidth of the phase locked loop is smaller (relative to during calibration mode). However, since the feedback path of the phase locked loop is now only responsible for tracking temperature variations, the bandwidth does not need to be large. The frequency of such temperature variations is determined by thermal time constants, which may be on the order of a second, so a low phase locked loop bandwidth is sufficient during chirp mode. If, during operation in chirp mode, the tuning range of the tracking input 135 is exceeded, the acquisition input 136 may be used to maintain lock.

A low pass filter (not shown) may be provided on the output of the DAC 44. The step response of the low pass filter is taken into account in the calibration mode, because it is in the loop. The low pass filter may reduce thermal noise and quantisation noise from the DAC 44.

Figure 13:
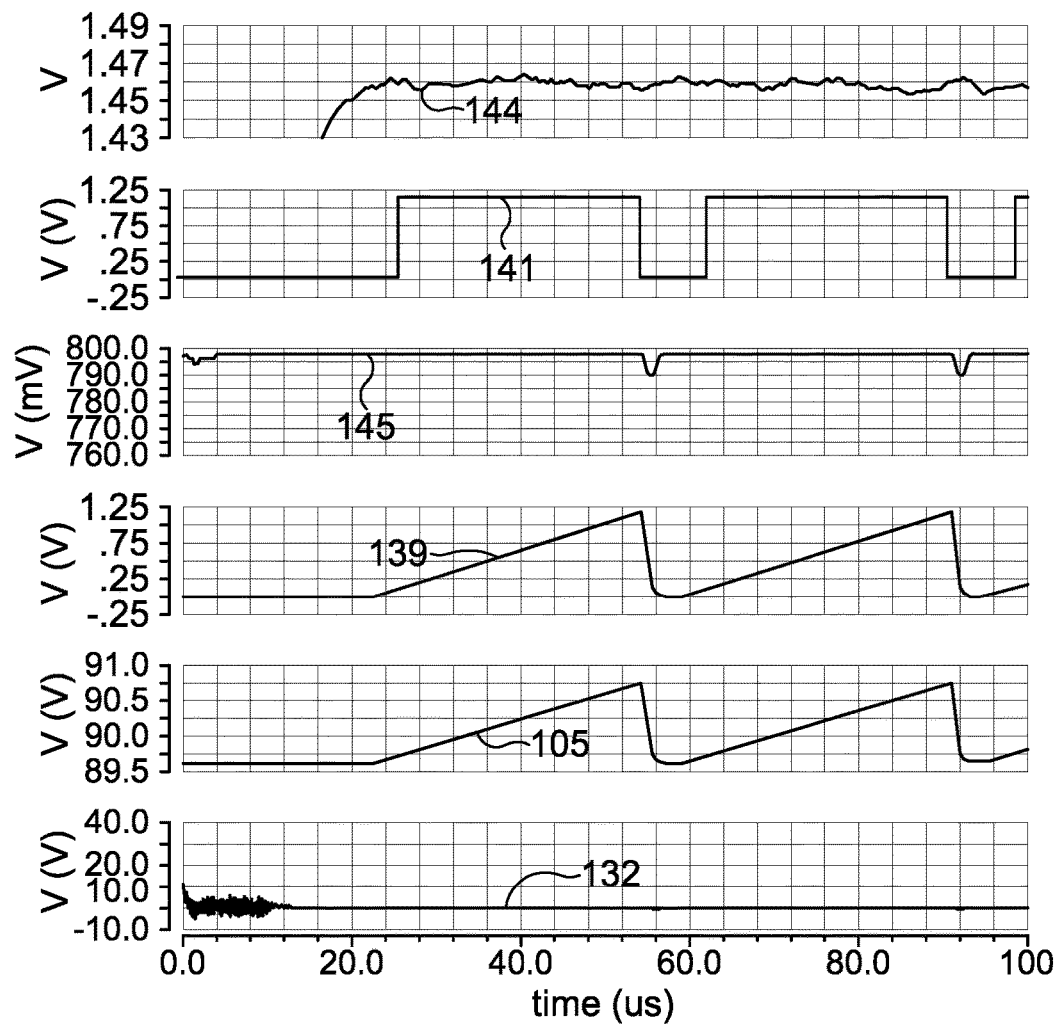
FIG. 13 is a graph of the voltages at various locations in a phase locked loop according to the further embodiment, showing the operation of the phase locked loop in a feed-forward controlled chirp mode.

FIG. 13 shows the operation of a phase locked loop according to an embodiment (e.g. as shown in FIG. 12), in a chirp mode. FIG. 13 shows TDC path calibration gain 144, chirp window 141, phase locked loop control voltage 145, DAC output 139, divider value 105 and phase error 132 during operation. After an initial period of acquisition (~16 µs), the phase locked loop locks onto the reference signal 101 and the phase error 132 drops to substantially zero. Two chirp cycles are output from the phase locked loop. The first chirp starts at around t=26 µs and ends at around t=55 µs, as indicated by the chirp window signal 141. During the chirp, the DAC 44 receives from the LUT 43 a sequence of digital signals 142 corresponding with a linear increase in frequency output from the oscillator 42. The DAC output 139 increases in a substantially linear way during the chirp. As discussed above the divider value 105 removes the effect of this in the feedback loop, so the divider value 105 substantially tracks the DAC output 139. The divider value 105 may be a digital value, so that the effect of the second control input (or DAC output) 139 on the frequency controlled oscillator 42 is removed in the digital domain.

The phase locked loop remains in lock both during the chirp window, and during the reset period of the chirp, with very low phase error 132. The gain calibration 144 of the TDC is not affected by the rapid changes in the output frequency of the phase locked loop, because these changes are removed in the feedback loop using the divider 14. The divider noise cancellation (by the quantisation noise cancellation block 11) is likewise not affected by the chirp operation: the phase error remains very well controlled throughout both the chirp window and reset periods.

The combination of feed-forward correction for distortion in the response of the frequency controlled oscillator 42 to the second control input 139 with a feedback loop that removes the effect of the second control input 139, results in a phase locked loop that is operable to produce a highly linear chirp signal with very low phase error throughout the chirp cycle.

From reading the present disclosure, other variations and modifications will be apparent to the skilled person. Such variations and modifications may involve equivalent and other features which are already known in the art of time to digital converters and phase locked loops, and which may be used instead of, or in addition to, features already described herein.

Although the appended claims are directed to particular combinations of features, it should be understood that the scope of the disclosure also includes any novel feature or any novel combination of features disclosed herein either explicitly or implicitly or any generalisation thereof, whether or not it relates to the same subject matter as presently claimed in any claim and whether or not it mitigates any or all of the same technical problems.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

What is claimed is:

1. A phase locked loop having a frequency controlled oscillator, a feedback path, a time to digital converter, and a memory, wherein:
   the frequency controlled oscillator comprises a first control input for varying a frequency of an output signal of the frequency controlled oscillator so as to track a reference frequency and a second control input for modulating the frequency of the output signal so as to produce a chirp;
   the feedback path is configured to provide an input signal based on the output signal of the frequency controlled oscillator to the time to digital converter, and comprises a modulation cancelling circuit operable to remove the frequency modulation resulting from the second control input from the output signal;
   the memory stores second control input values that each correspond with a desired chirp frequency and which compensate for non-linearity in a response of the frequency controlled oscillator to the second control input; and
   wherein the phase locked loop is operable in a chirp mode, in which the second control input is produced by determining a value for the second control input corresponding with a desired chirp frequency based on the stored second control input values in the memory, and in which the phase locked loop is configured to determine the first control input based on the feedback path from which the modulation cancelling circuit has removed the frequency modulation resulting from the second control input.

2. The phase locked loop of claim 1, wherein the phase locked loop comprises a frequency divider that receives the output signal and outputs the input signal to the time to digital converter; and a control circuit that controls the operation of the frequency divider, wherein the control circuit comprises a sigma-delta modulator for fractional-n frequency control.

3. The phase locked loop of claim 2, further comprising a quantisation noise cancelling circuit, configured to receive a signal based on the output of the time to digital converter and to reduce quantisation noise arising from quantisation in the control circuit.

4. The phase locked loop of claim 3, wherein the modulation cancelling circuit comprises the frequency divider.

5. The phase locked loop of claim 1, wherein the second control input comprises an analog input.

6. The phase locked loop of claim 1, wherein the first control input comprises a digital control input.

7. The phase locked loop of claim 1, wherein the frequency controlled oscillator comprises a switched capacitor varactor responsive to the first control input, and an analog varactor responsive to the second control input.

8. The phase locked loop of claim 7, wherein the first control input comprises a tracking input and an acquisition input, corresponding with a tracking switched capacitor bank and an acquisition switched capacitor bank, wherein the acquisition bank is operable to produce a larger tuning range of the frequency controlled oscillator than the tracking bank.

9. The phase locked loop of claim 8, wherein during chirp mode, the acquisition tuning bank is operable to maintain lock when the range of the tuning bank has been exceeded.

10. The phase locked loop of claim 9, further comprising a digital to analog converter, configured to convert the stored second control input values from the memory to an analog signal.

11. The phase locked loop of claim 10, further comprising a low pass filter between the output of the digital to analog converter and the second control input.

12. The phase locked loop of claim 1, wherein:
   the phase locked loop further comprises a loop filter that receives a phase error signal based on the output of the time to digital converter and is configured to provide the first control signal to the frequency controlled oscillator; and
   the phase locked loop is operable in a calibration mode, in which:
       the modulation cancelling circuit does not remove the frequency modulation resulting from the second control input in the feedback path, and
       the second control input is based on an output of the loop filter.

13. The phase locked loop of claim 12, wherein the phase locked loop is operable in the calibration mode to determine each of the stored second control input values by successively locking the phase locked loop onto each frequency of the chirp using the second control input, and storing in the memory a value based on the second control input after each lock has been achieved.

14. The phase locked loop of claim 1, wherein the time to digital converter comprises:

a synchronisation circuit configured to output a voltage pulse with duration based on a time difference between a reference oscillating signal and an input oscillating signal;

a charge pump arranged to receive the voltage pulse and to convert the voltage pulse into a current pulse;

an integrator comprising an integrator capacitor, the integrator being configured to receive the current pulse and integrate the current pulse as a charge on the integrator capacitor, resulting in an integrator output voltage; and a successive approximation register configured to determine the integrator output voltage with respect to a reference voltage by adjusting the charge on the integrator capacitor so as to reduce the integrator output voltage to within a least significant bit of a reference voltage by successive approximation, and configured to output the determined integrator output voltage as a digital signal.

15. A proximity radar comprising the phase locked loop of claim 1.

* * * * *